US012789318B2

(12) United States Patent
Nian et al.

(10) Patent No.: US 12,789,318 B2
(45) Date of Patent: Nov. 10, 2026

(54) APPARATUS AND METHOD FOR MONITORING CHEMICAL MECHANICAL POLISHING

(71) Applicant: TAIWAN SEMICONDUCTOR MANUFACTURING COMPANY, LTD., Hsinchu (TW)

(72) Inventors: Jun-Nan Nian, Hsinchu (TW); Jung-Chih Tsao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 694 days.

(21) Appl. No.: 17/885,809

(22) Filed: Aug. 11, 2022

(65) Prior Publication Data

US 2024/0051085 A1 Feb. 15, 2024

(51) Int. Cl.

*B24B 49/00* (2012.01)
*H10P 52/00* (2026.01)
*H10P 72/00* (2026.01)

(52) U.S. Cl.

CPC ............ *B24B 49/003* (2013.01); *H10P 52/00* (2026.01); *H10P 72/0604* (2026.01)

(58) Field of Classification Search

None

See application file for complete search history.

(56) References Cited

U.S. PATENT DOCUMENTS

| | | | | |
|---|---|---|---|---|
| 6,488,569 B1 * | 12/2002 | Wang | B24B 37/013 451/10 |
| 10,478,937 B2 | 11/2019 | Tang et al. | |
| 11,565,365 B2 | 1/2023 | Wang et al. | |
| 2002/0173223 A1 * | 11/2002 | Gitis | B24B 49/16 451/5 |
| 2019/0143474 A1 * | 5/2019 | Wang | B24B 49/003 438/5 |

FOREIGN PATENT DOCUMENTS

| | | | |
|---|---|---|---|
| TW | 201641216 A | | 12/2016 |
| TW | 201917503 A | | 5/2019 |
| TW | 201922415 A | | 6/2019 |
| TW | I668540 B | * | 8/2019 |

OTHER PUBLICATIONS

Machine translation of TWI668540B (Year: 2019).*

* cited by examiner

*Primary Examiner* — Matthew G Marini

(74) *Attorney, Agent, or Firm* — STUDEBAKER BRACKETT PLLC

(57) ABSTRACT

An apparatus for monitoring a CMP process on a wafer includes vibration sensors to collect vibration data corresponding to the CMP process and to transmit electric signals, a signal processor to obtain digital signals by converting the electric signals into a frequency domain, and filters to filter out noise signals from the digital signals to obtain noise reduced digital signals. The signal processor obtains one or more frequency spectrums from the noise reduced digital signals, and determines a micro-scratch occurrence on the wafer by analyzing the obtained one or more frequency spectrums. The vibration sensors are in rigid contact with at least a tool such as a head holding a carrier of the wafer or a platen holding a polishing pad. Each vibration sensor includes at least two sub-frequency-ranges respectively corresponding to at least two materials to be polished by the polishing pad.

20 Claims, 10 Drawing Sheets

APPARATUS AND METHOD FOR MONITORING CHEMICAL MECHANICAL POLISHING

BACKGROUND

As the semiconductor industry has progressed into nanometer technology process nodes in pursuit of higher device density, greater performance, and lower costs, challenges for both design and fabrication of integrated circuits have greatly increased. During manufacturing a semiconductor device, chemical mechanical polishing (CMP) processes are widely used to planarize wafers, however polishing pads can introduce mechanical defects such as scratches in the wafers due to the mechanical force used while polishing. Periodic optical observations of the wafers during the CMP processes may cause substantial down-time in the CMP processes, and thus may potentially reduce yield of the semiconductor device. Improved techniques for online monitoring and control of CMP processes are therefore desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
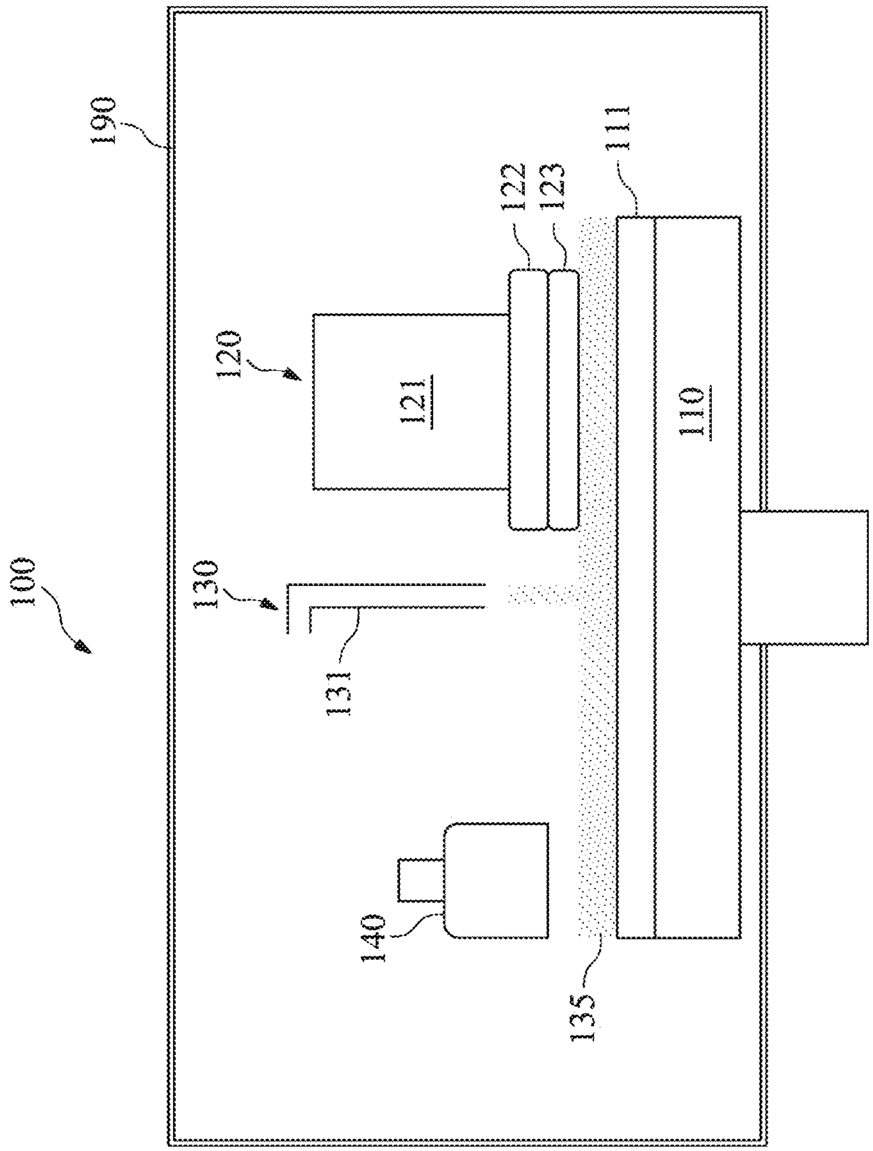
FIG. 1 is a schematic view of a chemical mechanical polishing (CMP) assembly in accordance with an embodiment.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term “made of” may mean either “comprising” or “consisting of.” Further, in the following fabrication process, there may be one or more additional operations in/between the described operations, and the order of operations may be changed. In the following embodiments, the term “upper” “over” and/or “above” are defined along directions with an increase in a distance from the front surface and the back surface. Materials, configurations, dimensions, processes and/or operations as explained with respect to one embodiment may be employed in the other embodiments, and the detailed description thereon may be omitted.

The present disclosure generally relates to a method and apparatus for monitoring and controlling a chemical mechanical polishing (CMP) process used in semiconductor manufacturing. More particularly, the method and apparatus described herein facilitate monitoring a CMP process for anomalous behavior, such as micro-scratch occurrence. Wafers are typically planarized using the CMP process that uses a polishing pad and a chemical slurry. The slurry is typically a colloid of a material that acts as a chemical etchant for etching the material at the top surface of the wafer. The polishing pad is typically rotated relative to the wafer while slurry is disposed so as to remove material and smooth any irregular topography. The CMP apparatus is not amenable to direct optical inspection during the process. Monitoring of the CMP process is therefore performed by periodically stopping the CMP process and inspecting the wafer, to determine whether an endpoint has been reached. Additionally, any anomalous outcome, such as a micro-scratch on the wafer surface, is only detected after stopping the process and inspecting the wafer, which may be too late to take corrective action. This results in a substantial bottleneck in the overall semiconductor manufacturing process, and affects the manufacturing yield. Embodiments of the apparatus and method described herein are expected to facilitate monitoring and control of the CMP process during operation without stopping the process, to determine micro-scratch occurrence on the wafer during the CMP process, and thus stop the CMP process on the wafer in cases where a severe micro-scratch occurrence is determined, thereby lessening time and costs of the CMP process, and increasing the speed and yield of the CMP process.

FIG. 1 schematically illustrates a chemical mechanical polishing (CMP) assembly 100 that performs a CMP process on a semiconductor wafer 123 in accordance with an embodiment of the present disclosure. In some embodiments of the present disclosure, the CMP assembly 100 includes a chamber 190 that encloses a rotatable platen 110, a polishing head assembly 120, a chemical slurry supply system 130, and a pad conditioner 140.

In an embodiment of the present disclosure, the platen 110 is connected to a motor (not explicitly shown) that rotates the platen 110 at a preselected rotational speed. In an embodiment, the platen 110 is covered with a replaceable polishing pad 111 (interchangeably referred to herein as "the pad") of a relatively soft material. In some embodiments of the present disclosure, the pad 111 is a thin polymeric disc with a grooved surface, and can be porous or solid, depending on the application. Factors determining the material and physical properties of the pad 111 include the material to be polished (such as one or more materials at the wafer surface), and the desired roughness after polishing. The pad 111 may have a pressure sensitive adhesive (not explicitly shown) on the back so that the pad 111 adheres to the platen 110. During the polishing process, the pad 111 may be wetted with a suitable lubricant material, depending on the type of the one or more materials being polished (i.e., the one or more materials at the top surface of the wafer 123).

In an embodiment of the present disclosure, the polishing head assembly 120 includes a head 121 and a carrier 122. The head 121 holds the carrier 122 that in turn holds a wafer 123 to be polished. In some embodiments, the polishing head assembly 120 includes a displacement mechanism (not explicitly shown) to oscillate the polishing head assembly 120 sideways. In some embodiments of the present disclosure, the head 121 may include a motor for rotating the wafer 123 relative to the platen 110. In some embodiments, the wafer 123 and the platen 110 are rotated in an asynchronous non-concentric pattern to provide a non-uniform relative motion between the platen 110 and the wafer 123. The non-uniformity of the relative motion facilitates uniform removal of material from the wafer surface by avoiding repeated removal from the same spot. The polishing head assembly 120 applies a controlled downward pressure to the wafer 123 to hold the wafer 123 against the platen 110.

In an embodiment of the present disclosure, the slurry supply system 130 introduces a chemical slurry 135 (interchangeably referred to herein as "the slurry") of a suitable material to be used as an abrasive medium between the pad 111 and the wafer 123. In some embodiments of the present disclosure, the slurry 135 is a colloid of abrasive particles dispersed in water with other chemicals such as rust inhibitors and bases to provide an alkaline pH. In some embodiments of the present disclosure, the abrasive particles are of materials such as, for example, silica, ceria, and alumina. In an embodiment of the present disclosure, the abrasive particles have a generally uniform shape and a narrow size distribution, with an average particle size ranging from about 10 nm to about 100 nm or more depending on the application for which it is being used. In some embodiments of the present disclosure, the slurry supply system 130 includes a storage system (not explicitly shown) and a conduit 131 for delivering the slurry 135 to the polishing pad 111 atop the platen 110. The rate of flow of the slurry 135 may be controlled based on the application.

In an embodiment of the present disclosure, the pad conditioner 140 periodically "conditions" the polishing pad 111 to provide uniform thickness and roughness across the entire area of the platen 110 by polishing the polishing pad 111. Maintaining the thickness and roughness of the polishing pad 111 prevents unwanted pressure points or warpage on the wafer 123 during the polishing process, and helps to maintain uniform thickness of the wafer 123.

The substantial mechanical movements of the platen 110 and the polishing head assembly 120 produce characteristic vibrations in the tools (such as the carrier 122, the head 121, and the platen 110) that are in direct or indirect rigid contact with the wafer 123 and/or the polishing pad 111 within the chamber 190 of the CMP assembly 100. The characteristic vibrations produced in the tools can be utilized to analyze and determine the polishing situation of the wafer 123 being polished by the polishing pad 111. The polishing situation of the wafer 123 includes, but not limited to, normal operations, and abnormality occurrences, such as micro-scratch occurrences.

Figure 2A:
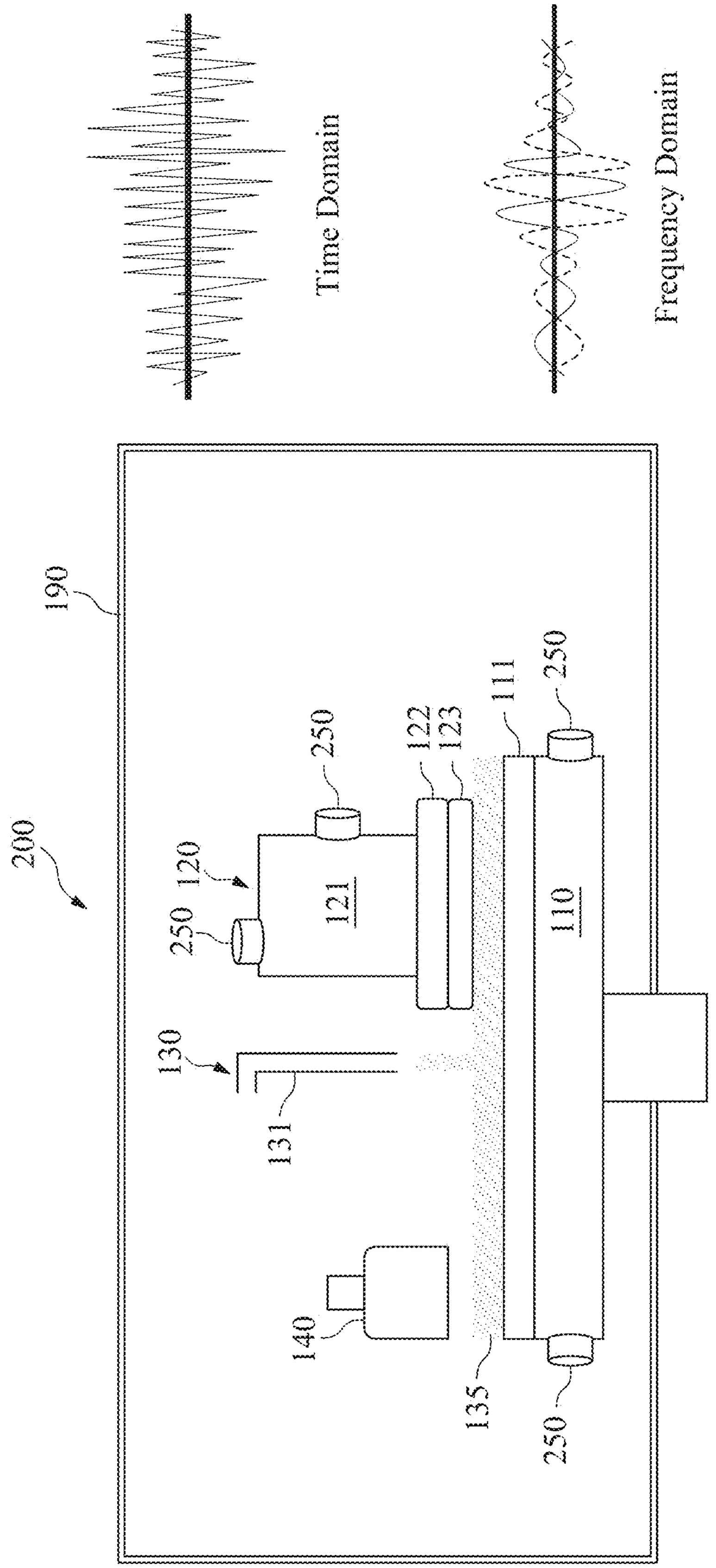
FIG. 2A is a schematic view of a CMP assembly monitored by vibration sensors and simulated time and frequency domain plots of vibrations emanating from the CMP assembly in accordance with an embodiment.
Figure 2B:
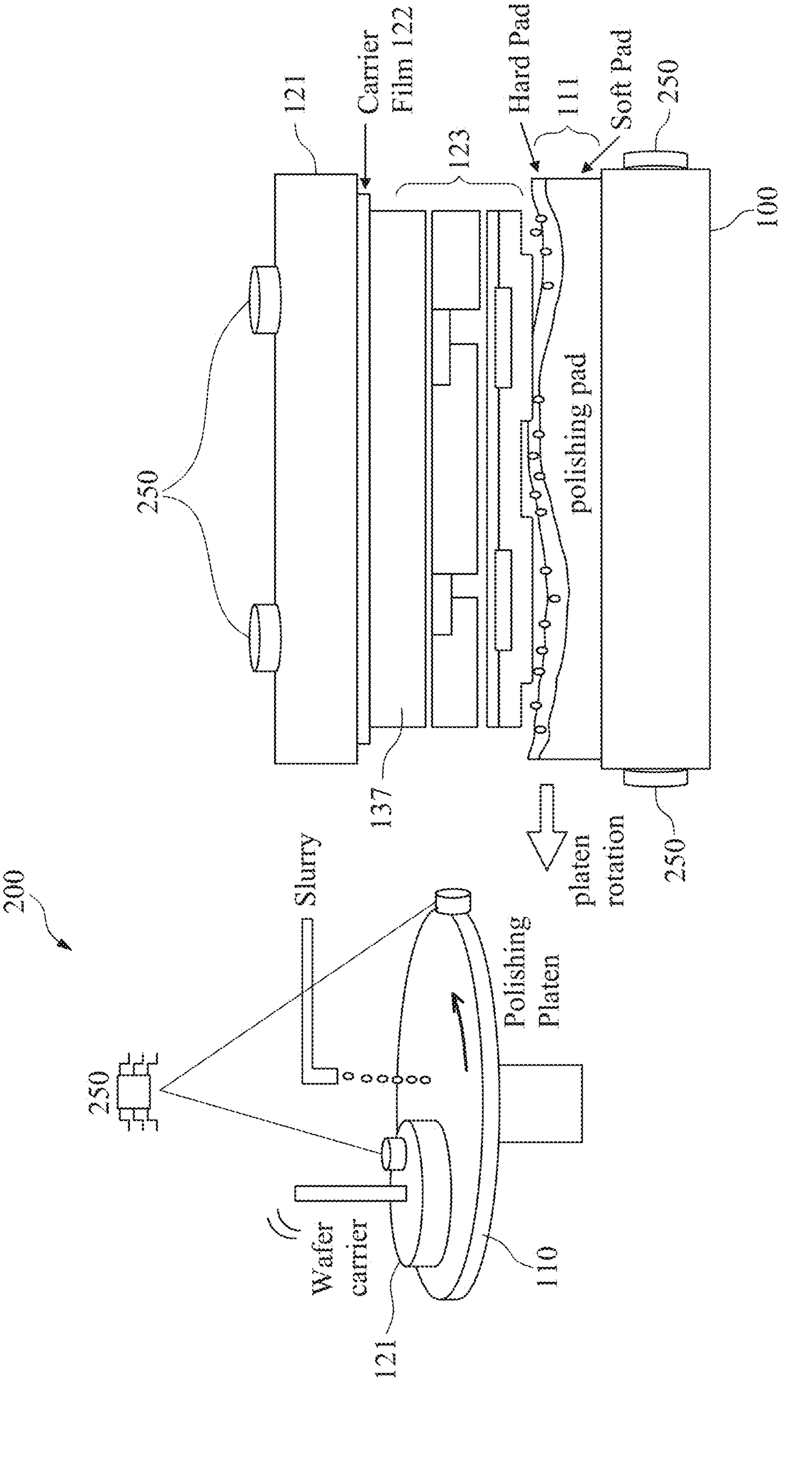
FIG. 2B is an enlarged schematic view of a CMP assembly monitored by vibration sensors in accordance with an embodiment.
Figure 2C:
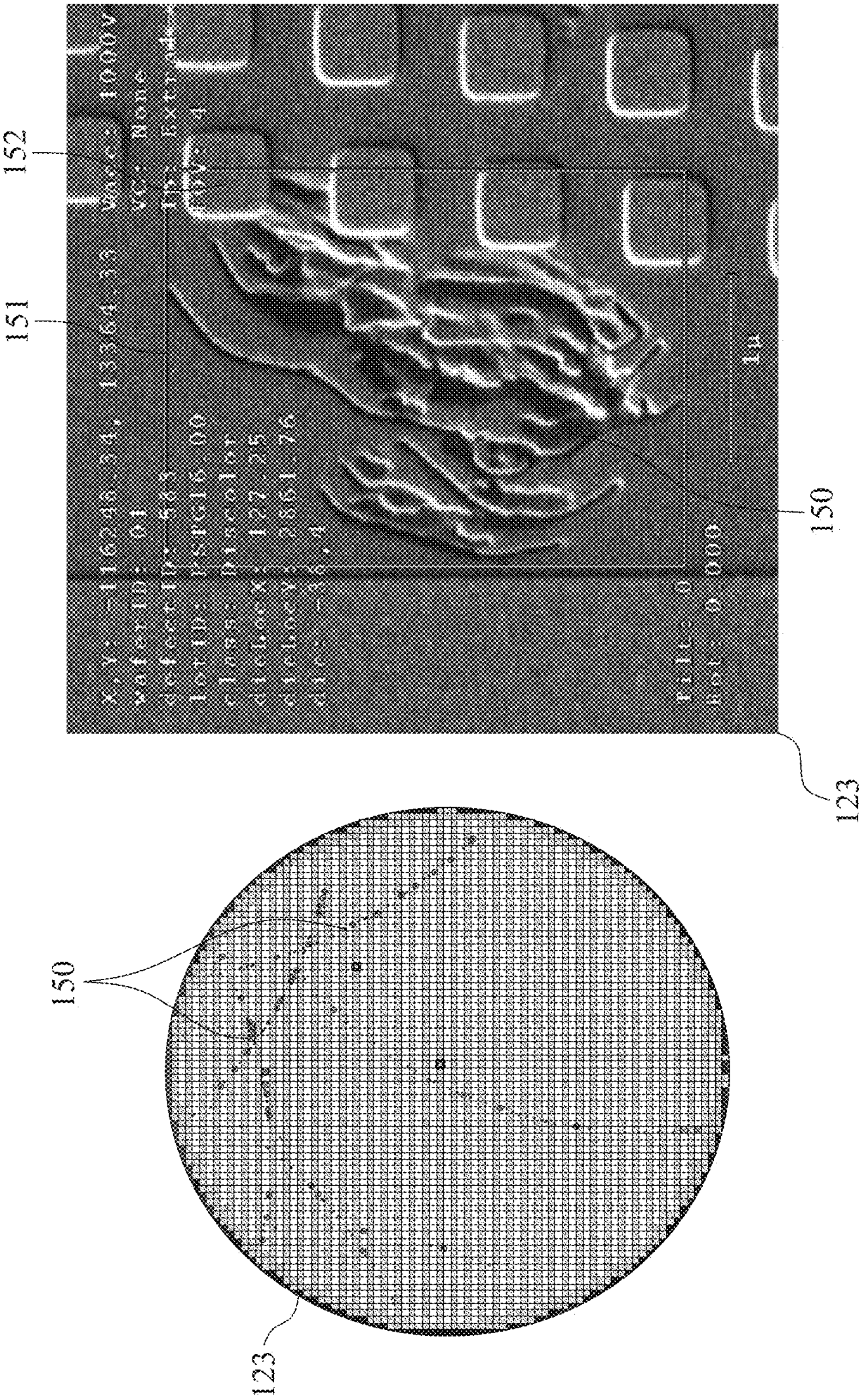
FIG. 2C illustrates views of a wafer having scratches caused by a polishing pad during a CMP process to be found or determined in accordance with an embodiment.

FIG. 2A is a schematic view of a CMP assembly 200 that performs a polishing operation on a wafer 123 and is monitored by one or more vibration sensors 250 in accordance with an embodiment of the present disclosure. FIG. 2B is an enlarged schematic view of the CMP assembly 200 that performs a CMP process on the wafer 123 and is monitored by the one or more vibration sensors 250 in accordance with an embodiment of the present disclosure. FIG. 2C illustrates views of a wafer 123 that includes scratches 150 caused by a polishing pad 111 during a CMP process found or determined in accordance with an embodiment.

In some embodiments of the present disclosure, the vibration sensors 250 are piezo sensors and/or acoustic emission (AE) sensors to collect vibration data corresponding to the CMP process of the CMP assembly 200. As shown in FIG. 2A, one or more vibration sensors 250 are disposed in direct contact with parts or tools (such as a platen 110 that holds the polishing pad 111 or a head 121 that holds a wafer carrier 122 that in turn holds a semiconductor wafer 123) that are in direct or indirect rigid contact with the polishing pad 111 and/or the wafer 123 within a chamber 190 of the CMP assembly 200.

In an embodiment of the present disclosure, a single vibration sensor 250 is disposed in direct contact with a platen 110 that is in direct rigid contact with the polishing pad 111. In another embodiment of the present disclosure, a single vibration sensor 250 is disposed in direct contact with a head 121 that is in indirect rigid contact with the wafer 123 through the wafer carrier 122. In further another embodiment, a single vibration sensor 250 is disposed in direct contact with a platen 110 that is in direct rigid contact with the polishing pad 111, and another single vibration sensor 250 is disposed in direct contact with a head 121 that is in indirect rigid contact with the wafer 123 through the wafer carrier 122.

In an embodiment of the present disclosure, at least two vibration sensors 250 are disposed in direct contact with a platen 110 that is in directly rigid contact with the polishing pad 111. In another embodiment, at least two vibration sensors 250 are disposed in direct contact with a head 121 that is in indirect rigid contact with the wafer 123 through the wafer carrier 122. In further another embodiment, at least two vibration sensors 250 are disposed in direct contact with a platen 110 that is in direct rigid contact with the polishing pad 111, and at least two other vibration sensors 250 are disposed in direct contact with a head 121 that is in indirect rigid contact with the wafer 123 through the wafer carrier 122.

Referring to FIG. 2B and FIG. 2C, in some embodiments of the present disclosure, the wafer 123 includes a semiconductor substrate 137 (such as a silicon substrate), integrated circuit (IC) elements (such as transistors, not explicitly shown) over the substrate 137, a first material layer 151 over the IC elements, and a second material layer 152 at least partially over the first material layer 151. In some embodiments, the first material layer 151 is a dielectric layer selected from the group consisting of a silicon oxide (e.g., SiO, $SiO_2$), a silicon nitride (e.g., $Si_3N_4$, SiN, etc.), SiON, SiOCN, a spin on glass, an aluminum oxide (e.g., $Al_2O_3$), any other suitable insulating material, and combinations thereof. In some embodiments, the second material layer is a conductive material selected from the group consisting of copper, aluminum, polysilicon, tungsten, nickel, cobalt, titanium, tantalum, molybdenum, any other suitable conductive material, and combinations thereof. As shown in FIG. 2C, the second material layer 152 at least partially protrudes over the first material layer 151.

FIG. 2A also illustrates simulated time and frequency domain plots of vibrations emanating from the CMP process of the CMP assembly 200 in accordance with an embodiment of the present disclosure. The frequency domain plots of the vibrations include frequency spectrums of the vibrations caused by the CMP process of the CMP assembly 200. During the CMP process, characteristic vibrations are respectively produced from polishing operations performed by the polishing pad 111 on different materials (such as a first material e.g., silicon oxide, and a second material e.g., Cu) of different material layers (such as the first material layer 151 and the second material layer 152) that are being polished.

In some embodiments of the present disclosure, the analysis of the vibration spectrums corresponding to the different materials is used to determine the polishing status or situation on the different materials. The amplitudes and frequencies of vibrations of parts or tools (such as the head 121 and the platen 110) that are in direct or indirect rigid contact with the polishing pad 111 or the wafer 123 within the chamber 190 may depend on factors such as, for example, rotational speed of the platen 110, rotational speed of the wafer 123, oscillation frequency of the head 121, alignment between the platen 110 and the wafer 123, material at the wafer surface, thickness of a film at the wafer surface, material immediately underneath a film at the wafer surface, material of the wafer 123, thickness of the wafer 123, composition of the slurry 135, rate of flow of the slurry 135, material of the polishing pad 111, and condition of the polishing pad 111, etc. Other factors determining the amplitudes and frequencies of vibrations of parts or tools that are in direct or indirect contact with the wafer 123 and/or the polishing pad 111 within the chamber 190 are contemplated to be within the scope of the present disclosure.

If the parameters of the CMP process remain the same, the vibration spectrum of a CMP process remains generally the same, otherwise as the parameters change the vibration spectrum should change. For example, a change in material at the wafer surface because of removal of a film at the top surface of the wafer changes the vibration spectrum depending on the material immediately underneath the film at the top surface of the wafer in some embodiments. Other changes and anomalies in the CMP process may also result in a change in the characteristic vibration spectrum associated with the CMP process. For example, a scratch on the wafer surface may result in a temporary change in composition of the slurry by temporarily adding particles of the material of the wafer surface to the slurry. These particles may get washed away as more slurry is added to the process and the process continues to operate. However, the temporary change in composition of the slurry may be sufficient to temporarily change the vibration spectrum associated with the CMP process.

As shown in FIG. 2C, the second material layer 152 (such as copper Cu) is deposited at least partially over the first material layer 151 (such as silicon oxide $SiO_2$), and thus the second material layer 152 at least partially protrudes from the first material layer 151. During the CMP process, while the polishing pad 111 is polishing the second material layer 152 of the wafer 123, scratches 150 caused by the polishing pad 111 on the second material layer 152 of the wafer 123 may result in scratches on the first material layer 151 (silicon oxide $SiO_2$) that is underneath the second material layer 152 (copper Cu). The scratches on the first material layer 151 may seriously affect the quality of the wafer 123, and thus may seriously affect the quality of the semiconductor device. In some embodiments of the present disclosure, once severe scratches 150 on the first material layer 151 (silicon oxide $SiO_2$) beneath the second material layer 152 are found or determined, the CMP assembly 200 will stop the CMP process on the wafer 123 to save time and costs of the semiconductor device manufacturing.

Figure 2E:
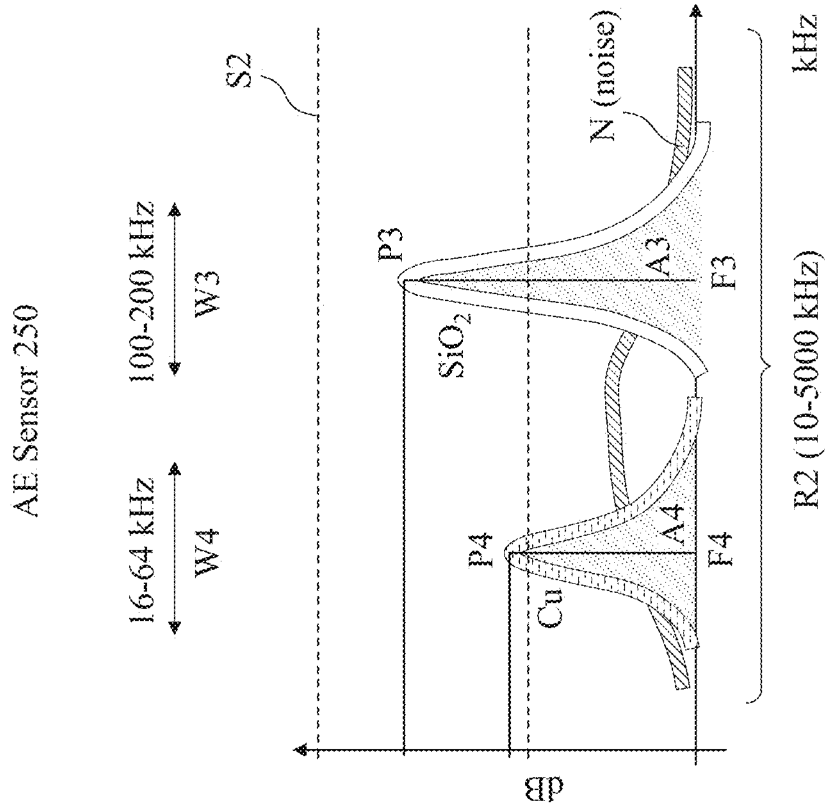
FIGS. 2D and 2E respectively illustrate features of two frequency spectrums respectively obtained from two different vibration sensors in accordance with an embodiment.
Figure 2D:
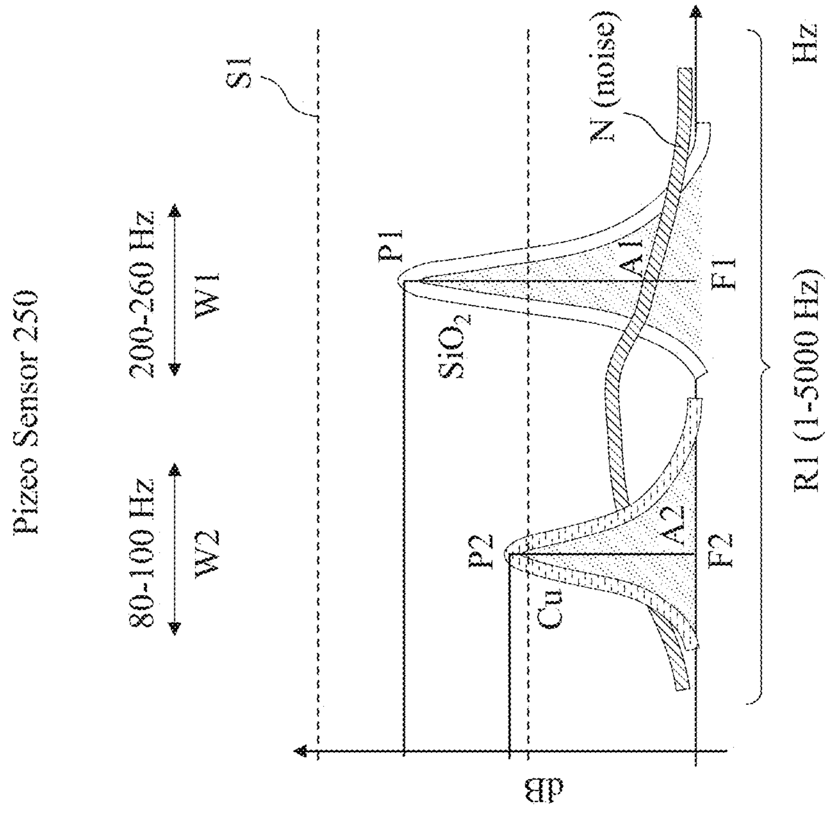

FIG. 2D illustrates features of two characteristic vibration frequency spectrums S1 and S2 respectively obtained by two different vibration sensors 250 in accordance with an embodiment. In some embodiments of the present disclosure, the vibration sensors 250 include piezo sensors. In other embodiments of the present disclosure, the vibration sensors 250 include acoustic emission (AE) sensors. In further other embodiments of the present disclosure, the vibration sensors 250 include both piezo sensors and acoustic emission sensors. Even though piezo sensors and acoustic emission sensors are illustrated, the vibration sensors 250 are not limited to piezo sensors and acoustic emission sensors in the present disclosure.

Table 1 below shows frequency ranges (e.g., R1 and R2) and sub-frequency-ranges (e.g., W1 and W2, W3 and W4) of a piezo sensor and an acoustic emission sensor. The piezo sensor has a first frequency range R1 (e.g., 1-5000 Hz) that includes a first sub-frequency-range W1 (e.g., 200-260 Hz) and a second sub-frequency-range W2 (e.g., 80-100 Hz) respectively corresponding to a first polished material (e.g., $SiO_2$) and a second polished material (e.g., Cu). The acoustic emission sensor has a second frequency range R2 (e.g., 10-5000 kHz) that includes a third sub-frequency-range W3 (e.g., 100-200 kHz) and a fourth sub-frequency-range W4 (e.g., 16-64 kHz) respectively corresponding to the first polished material (e.g., $SiO_2$) and the second polished material (e.g., Cu).

TABLE 1

| Sensors | Frequency Ranges (R) | Sub-Frequency-Ranges (W) | Materials Polished |
|---|---|---|---|
| piezo sensor | 1~5000 Hz (R1) | 200~260 Hz (W1) | $SiO_2$ (first) |
| | | 80~100 Hz (W2) | Cu (second) |
| AE sensor | 10~5000 kHz (R2) | 100~200 kHz (W3) | $SiO_2$ (first) |
| | | 16~64 kHz (W4) | Cu (second) |

As shown in FIG. 2D, the characteristic vibration frequency spectrum S1 obtained in the frequency domain by the piezo sensor 250 includes a first spike P1 having a first amplitude A1 at a first frequency center F1 and a second spike P2 having a second amplitude A2 at a second frequency center F2. As shown in FIG. 2E, the characteristic vibration frequency spectrum S2 obtained in the frequency domain by the acoustic emission sensor 250 includes a third spike P3 having a third amplitude A3 at a third frequency center F3 and a fourth spike P4 having a fourth amplitude A4 at a fourth frequency center F4. As shown in FIGS. 2D and 2E, any signal irrelevant to any of the first material (e.g., $SiO_2$) and the second material (e.g., Cu) in the frequency domain is treated as a noise signal N.

In some embodiments of the present disclosure, the analysis of the characteristic vibration frequency spectrum S1 and/or the characteristic vibration frequency spectrum S2 can determine a possible micro-scratch, a severity of the possible micro-scratch, and a micro-scratch occurrence on the second material layer (e.g., $SiO_2$) underneath the first material layer (e.g., Cu).

In an embodiment of the present disclosure, from the characteristic vibration frequency spectrum S1, a first ratio (ratio1) of the first spike amplitude A1 at the first central frequency F1 in the first sub-frequency-range W1 and the second spike amplitude A2 at the second central frequency F2 in the second sub-frequency-range W2 is detected (ratio1=A1/A2). Upon detecting the first ratio (ratio1) equal to or greater than a threshold value v1 (e.g., ratio1 v1, e.g., 0.5), the micro-scratch occurrence on the second material layer (e.g., $SiO_2$) is determined. The first ratio (ratio1) indicates a severity of a micro-scratch on the second material layer (e.g., $SiO_2$) that is underneath the first material layer (e.g., Cu), and thus, is helpful to determine the micro-scratch occurrence. The threshold value v1 is in a range from 0.4 to 0.6 in some embodiments.

In another embodiment of the present disclosure, from the characteristic vibration frequency spectrum S2, a second ratio (ratio2) of the third spike amplitude A3 at the third central frequency F3 in the third sub-frequency-range W3 and the fourth spike amplitude A4 at the fourth central frequency F4 in the fourth sub-frequency-range W4 is detected (ratio2=A3/A4). Upon detecting the second ratio (ratio2) equal to or greater than the threshold value v1 (e.g., ratio2>=v1, e.g., 0.5), the micro-scratch occurrence on the second material layer (e.g., $SiO_2$) is determined. The second ratio (ratio2) indicates a severity of a micro-scratch on the second material layer (e.g., $SiO_2$) that is underneath the first material layer (e.g., Cu), and thus, is helpful to determine the micro-scratch occurrence.

In further another embodiment of the present disclosure, the first ratio (ratio1) and the second ratio (ratio2) are respectively detected from the characteristic vibration frequency spectrums S1 and S2. Upon detecting a multiplication of the first ratio (ratio1) and the second ratio (ratio2) equal to or greater than a threshold value v2 (ratio1*ratio2>=v2, e.g., 0.25), the micro-scratch occurrence on the second material layer (e.g., $SiO_2$) is determined. The threshold value v2 is in a range from 0.20 to 0.30 in some embodiments. The multiplication (ratio1*ratio2) of the first ratio (ratio1) and the second ratio (ratio2) obtained from two different vibration sensors 250 indicates a severity of a micro-scratch on the second material layer (e.g., $SiO_2$) that is underneath the first material layer (e.g., Cu), and thus, is helpful to accurately determine a micro-scratch occurrence. In this way, the likelihood of mis-judgement or mis-determining the micro-scratch occurrence on the second material layer (e.g., $SiO_2$) that is beneath the first material (e.g., Cu) is lowered, and thus, the accuracy of determining the micro-scratch occurrence on the wafer 123 is improved.

Figure 3A:
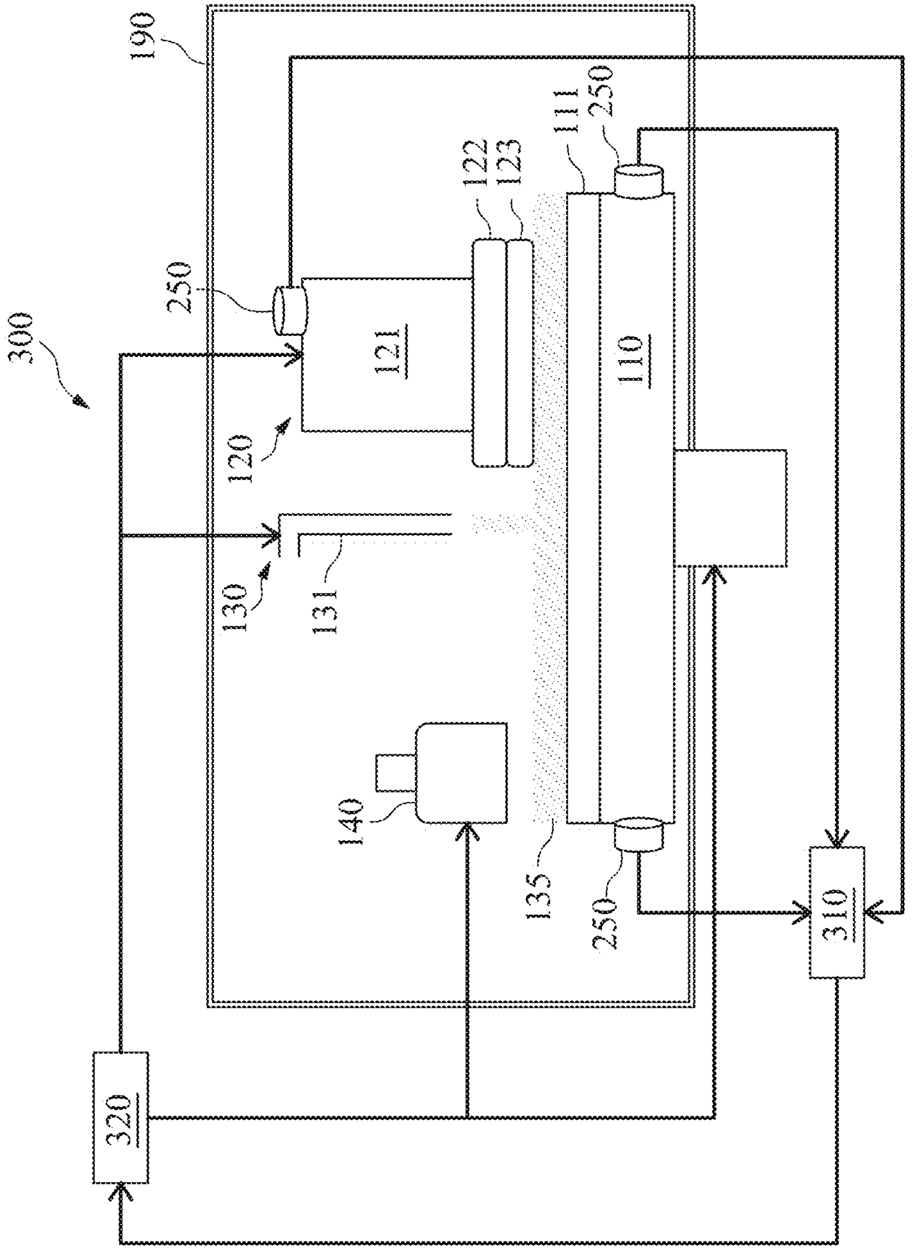
FIG. 3A is a schematic view of an apparatus for monitoring a CMP process on a wafer in accordance with an embodiment.
Figure 3B:
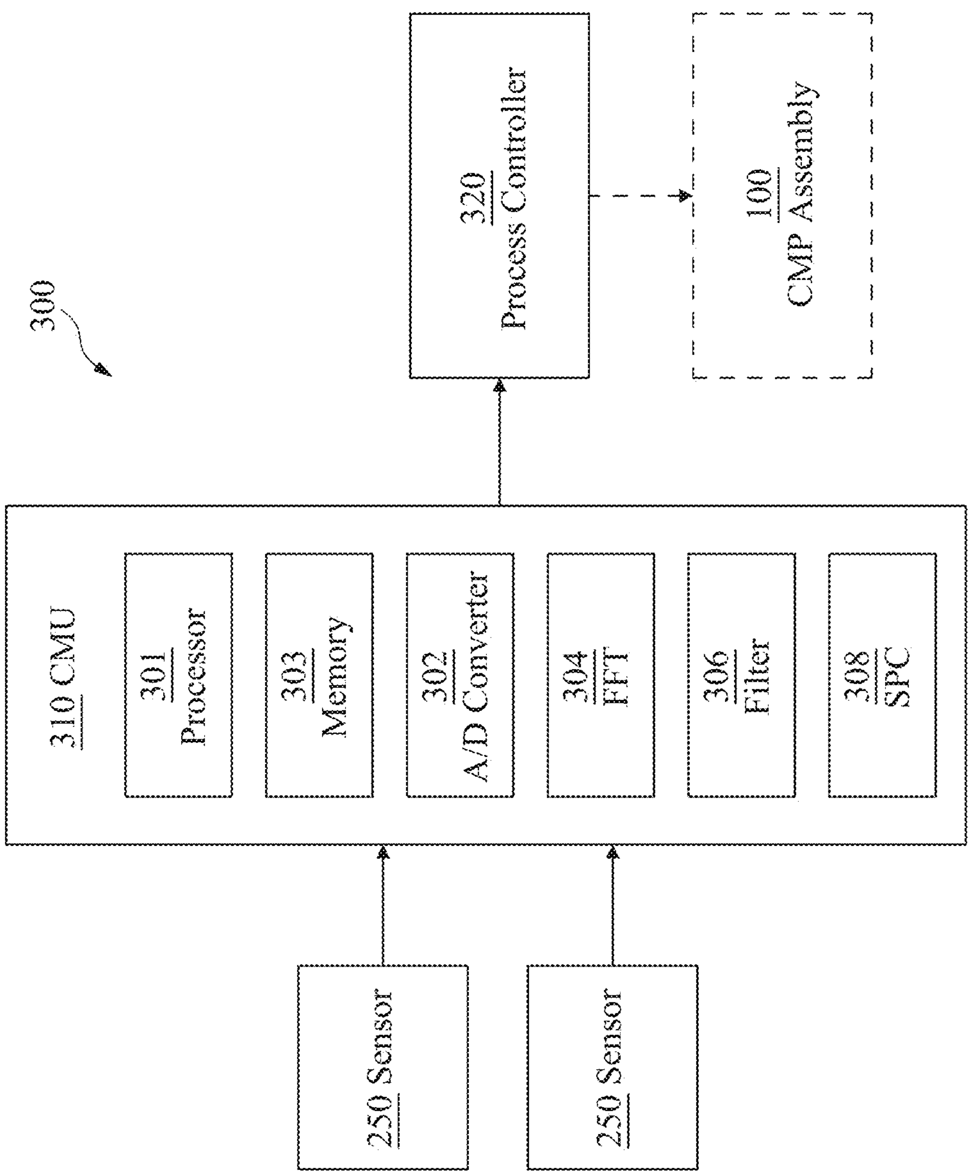
FIG. 3B is a block view of an apparatus for monitoring a CMP process on a wafer in accordance with an embodiment.
Figure 3C:
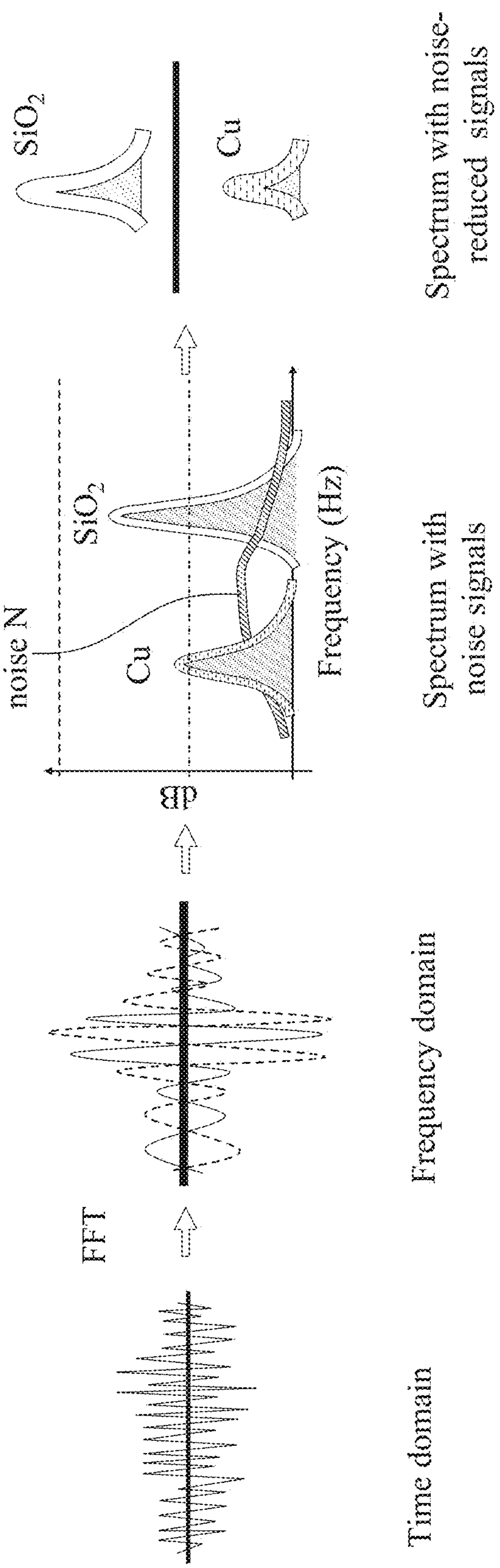
FIG. 3C illustrates some processing stages of vibration signals emanating from a CMP process in the time domain and the frequency domain in accordance with an embodiment.

FIG. 3A is a schematic view of an apparatus 300 for monitoring a CMP process on a wafer 123 in accordance with an embodiment of the present disclosure. FIG. 3B is a block view of the apparatus 200 for monitoring the CMP process in accordance with an embodiment of the present disclosure. In some embodiments, the monitoring apparatus 300 includes a set of vibration sensors 250, a signal processor 310, and a process controller 320. FIG. 3C illustrates some processing stages of vibration signals emanating from a CMP process in the time domain and the frequency domain in accordance with an embodiment of the present disclosure.

In some embodiments of the present disclosure, the set of vibration sensors 250 collect vibration data corresponding to the CMP process, obtain electric signals corresponding to the CMP process from the vibration data, and transmit the electric signals corresponding to the vibration data.

In some embodiments of the present disclosure, the signal processor 310 is a micro-processor unit (CMU) that includes a processor 301 and a memory 303.

In some embodiments of the present disclosure, the signal processor 310 also includes one or more analog-to-digital (A/D) converters 302 to convert analog electric signals into digital signals in a time domain, a Fast Fourier Transformation (FFT) algorithm 304 to perform FFT to convert the digital signals from the time domain into the frequency domain, and one or more filters 306 to reduce noise signals from the digital signals in the frequency domain to obtain noise reduced digital signals in the frequency domain.

As shown in FIG. 3C, in some embodiments of the present disclosure, the filters 306 filter out any noise digital signal N irrelevant to any of the first material (e.g., $SiO_2$) and the second material (e.g., Cu) in the frequency domain, and thus obtain noise-reduced digital signals.

In some embodiments of the present disclosure, the signal processor 310 obtains at least one frequency spectrum from the noise reduced digital signals, and determines an abnormality on the wafer 123 that is polished based on the obtained at least one frequency spectrum. In some embodiments, the signal processor 310 further includes a statistical process chart (SPC) 308. The signal processor 310 searches for an existing event frequency spectrum in the statistical process chart 308 using the obtained at least one frequency spectrum. Where the signal processor 310 finds that the existing event frequency spectrum corresponding to an existing micro-scratch event in the statistical process chart 308 matches the obtained at least one frequency spectrum, the signal processor 310 determines a micro-scratch occurrence on the wafer 123 based on the event associated with the existing event frequency spectrum in the statistical process chart 308.

In some embodiments of the present disclosure, upon determining a micro-scratch occurrence on the wafer 123, the signal processor 310 informs the process controller 320 of the micro-scratch occurrence on the wafer 123. In some embodiments of the present disclosure, upon being informed of the micro-scratch occurrence on the wafer 123 by the signal processor 310, the process controller 320 stops the CMP process performed by the CMP assembly 100 on the wafer 123.

Figure 4:
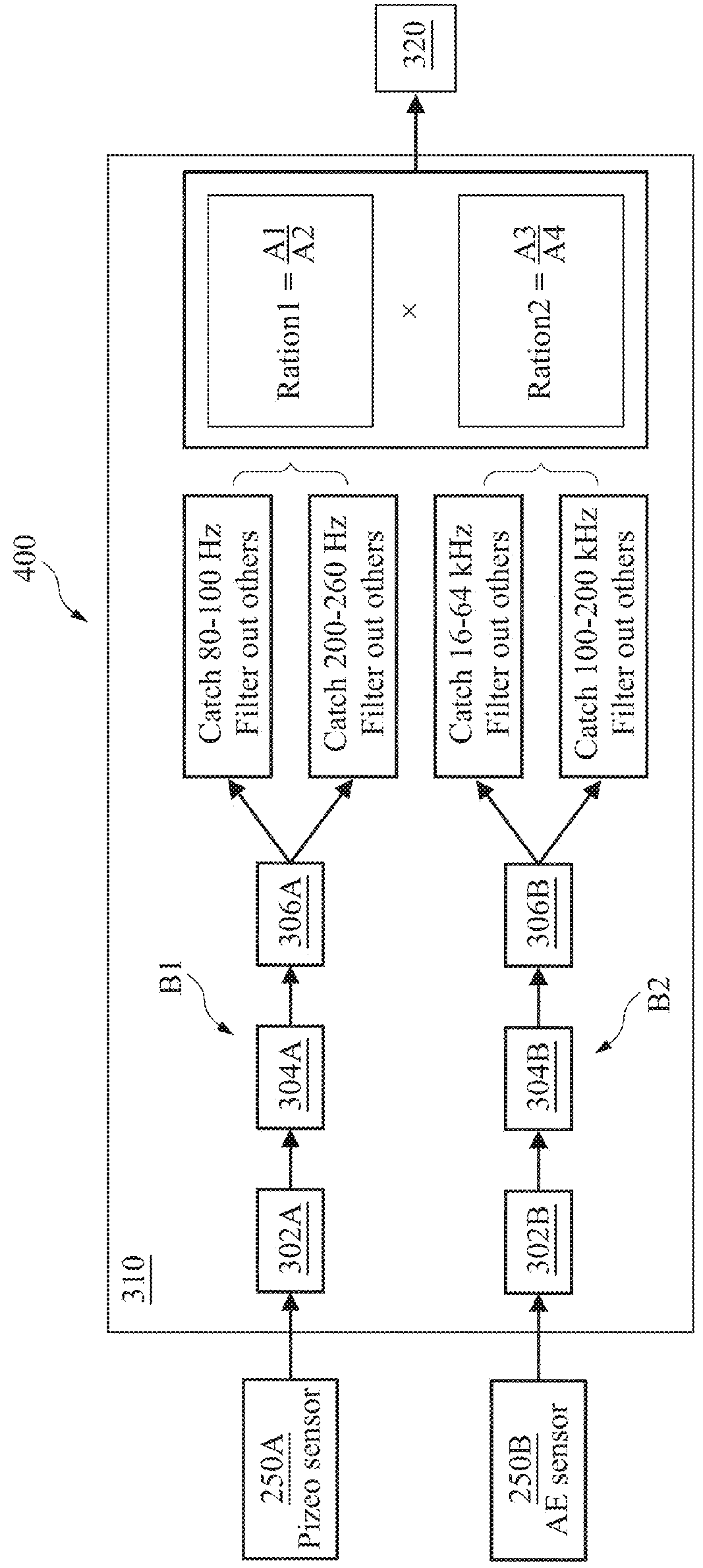
FIG. 4 is a schematic view of an apparatus for monitoring a CMP process on a wafer in accordance with another embodiment.

FIG. 4 is a schematic view illustrating an apparatus 400 for monitoring a CMP process on a wafer 123 in accordance with another embodiment. In some embodiments of the present disclosure, the monitoring apparatus 400 includes a set of vibration sensors 250 including a first vibration sensor 250A and a second vibration sensor 250B, a signal processor 310 including a first circuit branch B1 and a second circuit branch B2 in parallel and respectively electrically connected to the first vibration sensor 250A and the second vibration sensor 250B, and a process controller 320 electrically connected to the signal processor 310.

In some embodiments of the present disclosure, the first circuit branch B1 includes a first A/D convertor 302A, a first FFT algorithm 304A, and a first filter 306A that are serially connected, and the second circuit branch B2 includes a second A/D convertor 302B, a second FFT algorithm 304B, and a second filter 306B that are serially connected. The first vibration sensor 250A and the second vibration sensor 250B are respectively electrically connected to the first A/D convertor 302A and the second A/D convertor 302B of the signal processor 310.

In some embodiments of the present disclosure, the first vibration sensor 250A includes a piezo sensor, and the second vibration sensor 250B includes an acoustic emission (AE) sensor. In an embodiment of the present disclosure, both the first vibration sensor 250A and the second vibration sensor 250B are directly or indirectly in rigid contact with a head 121 holding a carrier 122 of the wafer. In another embodiment of the present disclosure, both the first vibration sensor 250A and the second vibration sensor 250B are directly or indirectly in rigid contact with a platen 110 of a CMP polishing pad 111. In further another embodiment of the present disclosure, the first vibration sensor 250A is directly or indirectly in rigid contact with the head 121 holding the carrier 122 of the wafer 123, and the second vibration sensor 250B is directly or indirectly in rigid contact with a platen 110 holding a CMP polishing pad 111.

In some embodiments of the present disclosure, the first vibration sensor 250A and the second vibration sensor 250B respectively collect a first vibration data and a second vibration data corresponding to the CMP process, to obtain first electric signals and second electric signals respectively corresponding to the first vibration data and second vibration data, and respectively transmit the first electric signals and the second electric signals to the first circuit branch B1 and the second circuit B2 of the signal processor 310.

In some embodiments of the present disclosure, the first A/D convertor 302A and the second A/D convertor 302B respectively receive the first electric signals and the second electric signals from the first vibration sensor 250A and the second vibration sensor 250B, and convert the first electric signals and the second electric signals into first digital signals and the second digital signals.

In some embodiments of the present disclosure, the first FFT algorithm 304A and the second FFT algorithm 304B respectively convert the first and the second digital signals from a time domain into a frequency domain.

In some embodiments of the present disclosure, the first filter 306A and the second filter 306B respectively filter out noise signals N from the first and the second digital signals in the frequency domain to obtain first and second noise-reduced digital signals in the frequency domain.

In some embodiments of the present disclosure, the first circuit branch B1 and the second circuit branch B2 of the signal processor 310 respectively obtain a first frequency spectrum S1 and a second frequency spectrum S2, respectively from the first and the second noise reduced digital signals. In some embodiments of the present disclosure, the signal processor 310 determines a micro-scratch occurrence on the wafer 123 based on both the first frequency spectrum S1 and the second frequency spectrum S2.

In some embodiments of the present disclosure, a wafer 123 is deposited with, among other things, a first material layer (such as $SiO_2$) over the wafer 123, and a second material layer (such as Cu) at least partially over the first material layer, and the first material layer is polished by a polishing pad 111.

Referring to e.g., FIG. 4 and FIG. 2D, the first vibration sensor 250A (e.g., a piezo sensor) senses vibrations in a first frequency range R1 (e.g., 1-5000 Hz). The first frequency range R1 includes a first sub-frequency-range W1 (e.g., 200-260 Hz) corresponding to the first material layer (e.g., $SiO_2$) and a second sub-frequency-range W2 (e.g., 80-100 Hz) corresponding to the second material layer (e.g., Cu).

Referring to e.g., FIG. 4 and FIG. 2E, the second vibration sensor 250B (e.g., an AE sensor) senses vibrations in a second frequency range R2 (e.g., 10-5000 kHz) that is different from the first frequency range R1. The second frequency range R2 includes a third sub-frequency-range W3 (e.g., 100-200 kHz) corresponding to the first material layer (e.g., $SiO_2$) and a fourth sub-frequency-range W4 (e.g., 16-64 kHz) corresponding to the second material layer (e.g., Cu).

In some embodiments of the present disclosure, from the first frequency spectrum S1 in the first frequency range R1, a first ratio (ratio1) of a first spike amplitude A1 at a first central frequency F1 in the first sub-frequency-range W1 and a second spike amplitude A2 at a second central frequency F2 in the second sub-frequency-range W2 is detected, where ratio1=A1/A2, and from the second frequency spectrum S2 in the second frequency range R2, a second ratio (ratio2) of a third spike amplitude A3 at a third central frequency F3 in the third sub-frequency-range W3 and a fourth spike amplitude A4 at a fourth central frequency F4 in the fourth sub-frequency-range W4 is detected, where ratio2=A3/A4.

In some embodiments of the present disclosure, upon detecting a multiplication (ratio1*ratio2) of the first ratio (ratio1) and the second ratio (ratio2) equal to or greater than a threshold value v2 (e.g., 0.25), the signal processor 310 determines the micro-scratch occurrence on the wafer 123. In some embodiments, upon determining the micro-scratch occurrence on the wafer 123, the signal processor 310 informs a process controller 320 to stop the CMP process on the wafer 123.

Figure 5:
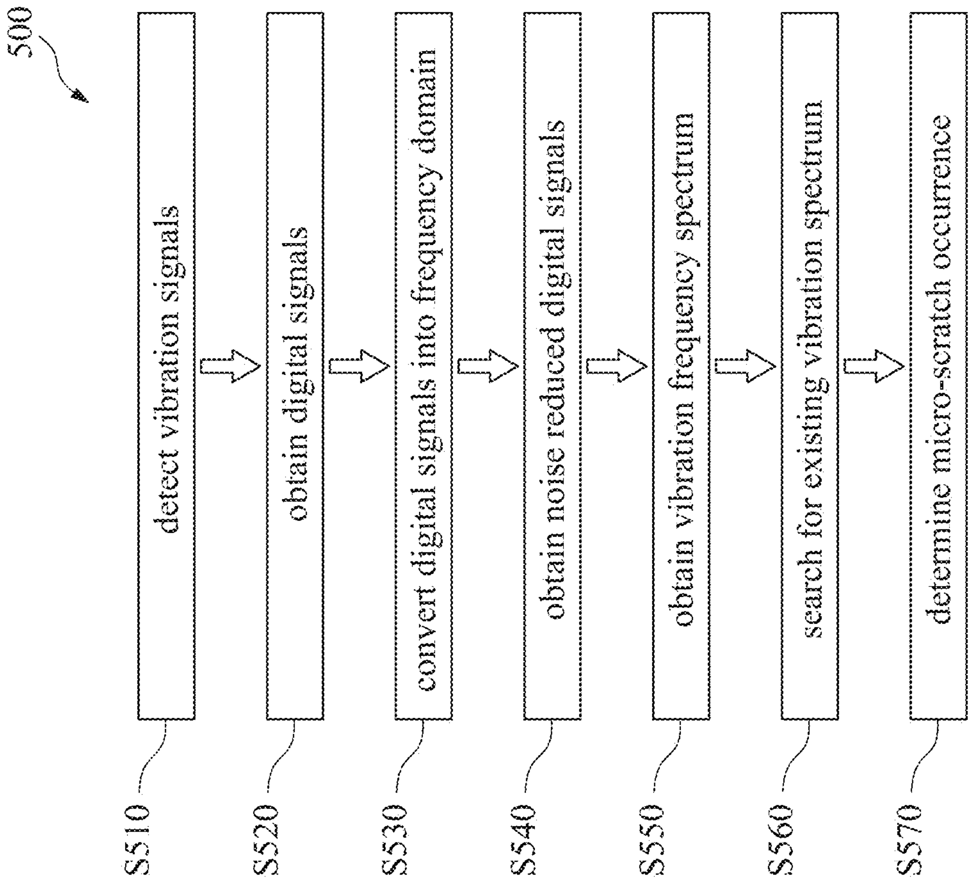
FIG. 5 is a flowchart showing a method of monitoring a CMP process on a wafer in accordance with an embodiment.

FIG. 5 is a flowchart showing a method 500 of monitoring a CMP process on a wafer 123 using a CMP monitoring apparatus (e.g., 300) in accordance with an embodiment of the present disclosure. It is understood that additional operations can be provided before, during, and after processes discussed in FIG. 5, and some of the operations described below can be replaced or eliminated, for additional embodiments of the method. The order of the operations/processes may be interchangeable and at least some of the operations/processes may be performed in a different sequence. In some embodiments of the present disclosure, at least two or more operations/processes are performed overlapping in time, or almost simultaneously.

In some embodiments of the present disclosure, as shown in FIG. 3B, the CMP monitoring apparatus 300 used in the method 500 of monitoring the CMP process on the wafer 123 includes a set of vibration sensors 250, a signal processor 310, and a process controller 320. In some embodiments, the signal processor 310 includes a processor 301, a memory 303, at least one A/D converter 302, a FFT algorithm 304, and at least one filter 306. In some embodiments, the signal processor 310 also includes a statistical process chart (SPC) 308.

The method 500 of monitoring a CMP process on a wafer 123 using a CMP monitoring apparatus 300 includes an operation S510 of detecting vibration signals that are caused by the CMP process being performed on the wafer 123 by using the set of vibration sensors 250. The set of vibration sensors 250 obtain analog electric signals corresponding to the vibration signals, and transmit the analog electric signals. In some embodiments, the set of vibration sensors 250 include one or more vibration sensors. In some embodiments, the one or more vibration sensors 250 are directly or indirectly in rigid contact with a head 121 holding a carrier 122 of the wafer 123 and/or a platen 110 holding a CMP polishing pad 111. In some embodiments, the one or more vibration sensors 250 include at least one piezo sensor and/or at least one acoustic emission (AE) sensor.

In operation S520, digital signals are obtained by the signal processor 310 from the analog electric signals. In some embodiments, the at least one A/D converter 302 of the signal processor 310 receives the analog electric signals and converts the analog electric signals into the digital signals. In operation S530, the digital signals are converted from a time domain into a frequency domain by performing Fast Fourier Transformation (FFT) 304. FIG. 2A illustrates simulated time and frequency domain plots of vibrations emanating from the CMP process performed on the wafer 123. Vibration spectrums corresponding to the vibration signals can be collected by set of vibration sensors 250, and may include noise signals. In some embodiments, as shown in FIG. 2C, the polishing pad 111 is polishing a wafer 123 that includes, among other things, a second material layer (e.g., Cu) over a first material layer (e.g., $SiO_2$). In some embodiments, as shown in FIGS. 2D and 2E, signals irrelevant to any of the first material (e.g., $SiO_2$) of the first material layer and the second material (e.g., Cu) of the second material layer in the frequency domain are treated as noise signals N.

In operation S540, noise-reduced digital signals in the frequency domain are obtained by one or more filters 306. In some embodiments, referring to FIG. 3C, the one or more filters 306 filter out the noise signals N irrelevant to any of the first material (e.g., $SiO_2$) and the second material (e.g., Cu) in the frequency domain, and thus obtain the noise-reduced digital signals in the frequency domain. In operation S550, at least one vibration frequency spectrum is obtained by the signal processor 310 from the noise reduced electric signals.

In operation S560, a processor 301 of the signal processor 310 searches for an existing micro-scratch vibration spectrum in a statistical process chart (SPC) 308 using the obtained at least one vibration frequency spectrum. In some embodiments, the SPC 308 is saved in the signal processor 310. In other embodiments, the SPC 308 is saved in a storage (not explicitly shown) outside the signal processor 310.

In operation S570, a micro-scratch occurrence on the wafer 123 is determined by the signal processor 310, upon finding an existing micro-scratch vibration spectrum in the SPC 308. In some embodiments, upon determining the micro-scratch occurrence on the wafer 123, the signal processor 310 sends a stop signal to a processor controller 320. In some embodiments, upon receiving a stop signal from the signal processor 310, the process controller 320 stops the CMP process performed on the wafer 123.

According to embodiments of the present disclosure, vibration signals corresponding to a CMP process on a wafer are collected by vibration sensors that are in direct or indirect rigid contact with the tool that is performing the CMP operation, and the vibration signals are processed by the signal processor to reduce or even cancel noise signals to obtain characteristic vibration frequency spectrums from the noise-reduced signals in the frequency domain. The signal processor can analyze the noise-reduced characteristic vibration frequency spectrums corresponding to different materials (such as Cu and $SiO_2$) of different material layers to accurately determine an abnormality situation such as micro-scratch occurrence during the CMP process on the wafer, and thus timely inform the processor controller to stop the CMP process on the wafer in case that a severe micro-scratch occurrence is determined to lessen time and costs of the CMP process thereby improving the CMP process.

In accordance with an aspect of the present disclosure, an apparatus for monitoring a chemical mechanical polishing (CMP) process on a wafer includes at least one vibration sensor configured to collect vibration data corresponding to the CMP process and to transmit electric signals corresponding to the vibration data; a signal processor configured to obtain digital signals from the electric signals and to convert the digital signals into a frequency domain, the signal processor including a filter to obtain noise reduced digital signals from the digital signals, the signal processor is configured to obtain at least one frequency spectrum from the noise reduced digital signals, and to determine an abnormality occurrence on the wafer based on the at least one frequency spectrum; and a process controller configured to stop the CMP process upon being informed of the abnormality occurrence by the signal processor. In one or more of the foregoing and/or following embodiments, the signal processor is configured to search for an existing event frequency spectrum in a statistical process chart using the obtained at least one frequency spectrum, and to determine the abnormality occurrence on the wafer where the existing event frequency spectrum is found in the statistical process chart. In one or more of the foregoing and/or following embodiments, the signal processor further includes an analog-to-digital converter to convert the electric signals into the digital signals in a time domain, and is configured to perform Fast Fourier Transformation to convert the digital signals from the time domain into the frequency domain. In one or more of the foregoing and/or following embodiments, the at least one vibration sensor includes a piezo sensor or an acoustic emission sensor. In one or more of the foregoing and/or following embodiments, the at least one vibration sensor is directly or indirectly in rigid contact with a head holding a carrier of the wafer or directly or indirectly in rigid contact with a platen holding a polishing pad. In one or more of the foregoing and/or following embodiments, the wafer is deposited with a first material layer and a second material layer at least partially over the first material layer, and the at least one vibration sensor senses vibrations in a first frequency range including a first sub-frequency-range corresponding to the first material layer and a second sub-frequency-range corresponding to the second material layer. In one or more of the foregoing and/or following embodiments, the signal processor is configured to detect in the first frequency range a first ratio of a first spike amplitude at a first central frequency in the first sub-frequency-range and a second spike amplitude at a second central frequency in the second sub-frequency-range (ratio1=A1/A2) and detect in the second frequency range a second ratio of a third spike amplitude at a third central frequency in the third sub-frequency-range and a fourth spike amplitude at a fourth central frequency in the fourth sub-frequency-range (ratio2=A3/A4). In one or more of the foregoing and/or following embodiments, the abnormality occurrence includes a micro-scratch occurrence on the wafer, and upon detecting a ratio of a first spike amplitude at a first central frequency in the first sub-frequency-range and a second spike amplitude at a second central frequency in the second sub-frequency-range equal to or greater than a threshold value, the signal processor determines the micro-scratch occurrence on the wafer.

In accordance with an aspect of the present disclosure, an apparatus for monitoring a chemical mechanical polishing (CMP) process on a wafer includes: a first and a second vibration sensors configured to respectively collect first and second vibration data corresponding to the CMP process and to respectively transmit first and second electric signals respectively corresponding to the first and second vibration data; and a signal processor configured to obtain first and second digital signals respectively from the first and the second electric signals and to convert the first and the second digital signals from a time domain into a frequency domain. The signal processor includes a first and a second filters configured to respectively obtain first and second noise reduced digital signals by respectively filtering out noise signals from the first and the second digital signals, and the signal processor is configured to obtain a first and a second frequency spectrums respectively from the first and the second noise reduced digital signals and to determine a micro-scratch occurrence on the wafer based on both the first and the second frequency spectrums. In one or more of the foregoing and/or following embodiments, the first vibration sensor includes a piezo sensor, and the second vibration sensor includes an acoustic emission sensor. In one or more of the foregoing and/or following embodiments, both the first vibration sensor and the second vibration sensor are directly or indirectly in rigid contact with a head holding a carrier of the wafer. In one or more of the foregoing and/or following embodiments, both the first vibration sensor and the second vibration sensor are directly or indirectly in rigid contact with a platen of a polishing pad. In one or more of the foregoing and/or following embodiments, the first vibration sensor is directly or indirectly in rigid contact with a head holding a carrier of the wafer, and the second vibration sensor is directly or indirectly in rigid contact with a platen holding a polishing pad. In one or more of the foregoing and/or following embodiments, the wafer is deposited with a first material layer and a second material layer at least partially over the first material layer, the first vibration sensor senses vibrations in a first frequency range, the first frequency range including a first sub-frequency-range corresponding to the first material layer and a second sub-frequency-range corresponding to the second material layer, and the second vibration sensor senses vibrations in a second frequency range different from the first frequency range, the second frequency range including a third sub-frequency-range corresponding to the first material layer and a fourth sub-frequency-range corresponding to the second material layer. In one or more of the foregoing and/or following embodiments, a first ratio of a first spike amplitude at a first central frequency in the first sub-frequency-range and a second spike amplitude at a second central frequency in the second sub-frequency-range is detected in the first frequency range; and a second ratio of a third spike amplitude at a third central frequency in the third sub-frequency-range and a fourth spike amplitude at a fourth central frequency in the fourth sub-frequency-range detecting in the second frequency range. In one or more of the foregoing and/or following embodiments, upon detecting a multiplication of the first ratio and the second ratio equal to or greater than a threshold value, the signal processor determines the micro-scratch occurrence on the wafer. In one or more of the foregoing and/or following embodiments, upon determining the micro-scratch occurrence on the wafer, the signal processor informs a process controller to stop the CMP process on the wafer.

In accordance with an aspect of the present disclosure, a method of monitoring a chemical mechanical polishing (CMP) operation on a wafer includes detecting vibration signals by one or more sensors configured to transmit electric signals corresponding to the vibration data; obtaining digital signals by a signal processor from the electric signals; converting the digital signals from a time domain into a frequency domain by performing Fast Fourier Transformation; obtaining noise reduced digital signals in the frequency domain by filtering out noise signals from the digital signals using one or more filters; obtaining by the signal processor at least one vibration frequency spectrum from the noise reduced electric signals; searching by the signal processor for an existing micro-scratch vibration spectrum in a statistical process chart (SPC) using the obtained at least one vibration frequency spectrum; and determining by the signal processor a micro-scratch occurrence on the wafer upon finding the existing micro-scratch vibration spectrum in the SPC. In one or more of the foregoing and/or following embodiments, the one or more sensors are directly or indirectly in rigid contact with a head holding a carrier of the wafer and/or a platen holding a polishing pad. In one or more of the foregoing and/or following embodiments, the signal processor sends a stop signal to a processor controller upon determining the micro-scratch occurrence on the wafer exceeds a threshold value. In one or more of the foregoing and/or following embodiments, the process controller stops the CMP process on the wafer upon receiving the stop signal from the signal processor.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A semiconductor manufacturing method, comprising:

starting a CMP operation on a wafer;

detecting vibration signals in at least four sub-frequency ranges by one or more sensors to transmit electric signals corresponding to vibration data, wherein a first two sub-frequency ranges correspond to a first material and a second two sub-frequency ranges correspond to a second material;

obtaining digital signals by a signal processor from the electric signals;

converting the digital signals from a time domain into a frequency domain by performing Fast Fourier Transformation;

obtaining noise reduced digital signals in the frequency domain by filtering out noise signals from the digital signals using one or more filters;

obtaining by the signal processor at least one vibration frequency spectrum from the noise reduced digital signals;

searching by the signal processor for an existing micro-scratch vibration spectrum in a statistical process chart using the at least one vibration frequency spectrum;

determining, by the signal processor, a micro-scratch occurrence on the wafer by performing operations comprising:

detecting a first spike amplitude A1 at a first central frequency in a first sub-frequency range, detecting a second spike amplitude A2 at a second central frequency in a second sub-frequency range, in the at least one vibration frequency spectrum, and forming a first ratio1 given by A1/A2 of the first spike amplitude A1 and the second spike amplitude A2;

detecting a third spike amplitude A3 at a third central frequency in a third sub-frequency range, detecting a fourth spike amplitude A4 at a fourth central frequency in a fourth sub-frequency range, and forming a second ratio2 given by A3/A4 of the third spike amplitude A3 and the fourth spike amplitude A4; and stopping the CMP operation based on at least one of the first ratio1 or the second ratio2.

2. The method of claim 1, wherein the one or more sensors are directly or indirectly in rigid contact with a head holding a carrier of the wafer and/or a platen holding a polishing pad.

3. The method of claim 1, further comprising sending by the signal processor a stop signal to a processor controller upon determining that at least one of the first ratio1 or the second ratio2 exceeds a threshold value.

4. The method of claim 3, wherein stopping the CMP operation further comprises stopping the CMP operation by a process controller upon receiving the stop signal from the signal processor.

5. A semiconductor manufacturing method, comprising:

starting a CMP operation on a wafer;

detecting vibrational signals in at least four sub-frequency ranges using at least one of a piezo sensor or an acoustic emission sensor, wherein a CMP apparatus performing the CMP operation includes the at least one of the piezo sensor or the acoustic emission sensor, wherein a first two sub-frequency ranges correspond to a first material and a second two sub-frequency ranges correspond to a second material;

determining a vibration frequency spectrum from the vibrational signals;

detecting a first spike amplitude A1 at a first central frequency in a first sub-frequency range, detecting a second spike amplitude A2 at a second central frequency in a second sub-frequency range, and forming a first ratio1 given by A1/A2 of the first spike amplitude A1 and the second spike amplitude A2;

detecting a third spike amplitude A3 at a third central frequency in a third sub-frequency range, detecting a fourth spike amplitude A4 at a fourth central frequency in a fourth sub-frequency range, and forming a second ratio2 given by A3/A4 of the third spike amplitude A3 and the fourth spike amplitude A4;

determining an abnormality occurrence on the wafer based on at least one of the first ratio1 or the second ratio2; and stopping the CMP operation based on the abnormality occurrence.

6. The method of claim 5, further comprising:

searching for an existing event frequency spectrum in a statistical process chart using the vibration frequency spectrum, wherein the determining the abnormality occurrence on the wafer based on the vibration frequency spectrum includes finding the existing event frequency spectrum in the statistical process chart.

7. The method of claim 5, further comprising:

converting electrical signals from the at least one of the piezo sensor or the acoustic emission sensor into digital signals;

filtering the digital signals to obtain noise-reduced digital signals; and generating the vibration frequency spectrum from the noise-reduced digital signals.

8. The method of claim 7, wherein converting the electrical signals from the at least one of the piezo sensor or the acoustic emission sensor into the digital signals includes converting the electrical signals into the digital signals in a time domain, and the method further comprises performing a Fast Fourier Transform algorithm to convert the noise-reduced digital signals from the time domain into a frequency domain.

9. The method of claim 5, further comprising:

configuring the at least one of the piezo sensor or the acoustic emission sensor to be directly or indirectly in rigid contact with a head holding a carrier of the wafer or directly or indirectly in rigid contact with a platen holding a polishing pad.

10. The method of claim 5, further comprising:

depositing a first material layer over the wafer;

depositing a second material layer at least partially over the first material layer; and controlling the at least one of the piezo sensor or the acoustic emission sensor to detect the vibrational signals in a first frequency range including the first sub-frequency range corresponding to the first material layer and the second sub-frequency range corresponding to the second material layer.

11. The method of claim 10, wherein:

the first sub-frequency range is from 200 Hz to 260 Hz;

the second sub-frequency range is from 80 Hz to 100 Hz; and determining the abnormality occurrence on the wafer based on the vibration frequency spectrum further comprises comparing at least one of the first ratio1 or the second ratio2 to a threshold and determining a presence of a micro-scratch occurrence when the first ratio1 or the second ratio2 is greater than the threshold.

12. A semiconductor manufacturing method, comprising:

starting a CMP operation on a wafer;

detecting vibrational signals in at least four sub-frequency ranges comprising a first vibration signal and a second vibration signal corresponding to the CMP operation by a first vibration sensor and a second vibration sensor, wherein a first two sub-frequency ranges correspond to a first material and a second two sub-frequency ranges correspond to a second material;

converting the first vibration signal and the second vibration signal respectively to a first digital signal and a second digital signal, with both signals represented in a time domain;

converting the first digital signal and the second digital signal from the time domain into a frequency domain;

filtering the first digital signal and the second digital signal to respectively generate a first noise-reduced digital signal and a second noise-reduced digital signal;

determining a first frequency spectrum and a second frequency spectrum respectively from the first noise-reduced digital signal and the second noise-reduced digital signal;

detecting a first spike amplitude A1 at a first central frequency in a first sub-frequency range, detecting a second spike amplitude A2 at a second central frequency in a second sub-frequency range, and forming a first ratio1 given by A1/A2 of the first spike amplitude A1 and the second spike amplitude A2;

detecting a third spike amplitude A3 at a third central frequency in a third sub-frequency range, detecting a fourth spike amplitude A4 at a fourth central frequency in a fourth sub-frequency range, and forming a second ratio2 given by A3/A4 of the third spike amplitude A3 and the fourth spike amplitude A4; and stopping the CMP operation based on at least one of the first ratio1 or the second ratio2.

13. The method of claim 12, wherein:

the first vibration sensor comprises a piezo sensor and the second vibration sensor comprises an acoustic emission sensor;

the detecting the first vibration signal comprises controlling the piezo sensor to detect the first vibration signal; and the detecting the second vibration signal comprises controlling the acoustic emission sensor to detect the second vibration signal.

14. The method of claim 12, further comprising:

configuring the first vibration sensor and the second vibration sensor to be directly or indirectly in rigid contact with a head holding a carrier of the wafer.

15. The method of claim 12, further comprising:

configuring the first vibration sensor and the second vibration sensor to be directly or indirectly in rigid contact with a platen of a polishing pad.

16. The method of claim 12, further comprising:

configuring the first vibration sensor to be directly or indirectly in rigid contact with a head holding a carrier of the wafer, and configuring the second vibration sensor to be directly or indirectly in rigid contact with a platen holding a polishing pad.

17. The method of claim 12, further comprising:

depositing a first material layer over the wafer;

depositing a second material layer at least partially over the first material layer;

controlling the first vibration sensor to sense vibrations in a first frequency range including the first sub-frequency range corresponding to the first material layer and the second sub-frequency range corresponding to the second material layer; and controlling the second vibration sensor to sense vibrations in a second frequency range different from the first frequency range, the second frequency range including the third sub-frequency range corresponding to the first material layer, and the fourth sub-frequency range corresponding to the second material layer.

18. The method of claim 17, wherein:

the first sub-frequency range is from 200 Hz to 260 Hz;

the second sub-frequency range is from 80 Hz to 100 Hz;

the third sub-frequency range is from 100 kHz to 200 kHz; and the fourth sub-frequency range is from 16 kHz to 64 kHz.

19. The method of claim 18, further comprising:

forming a product of the first ratio1 times the second ratio2; and determining a micro-scratch occurrence when the product of the first ratio1 and the second ratio2 exceeds a threshold v2:ratio1*ratio2>=v2.

20. The method of claim 19, wherein stopping the CMP operation further comprises:

stopping the CMP operation upon determining the micro-scratch occurrence.

* * * * *